(12) United States Patent
Juan Lu

(10) Patent No.: US 11,871,561 B2
(45) Date of Patent: Jan. 9, 2024

(54) SEMICONDUCTOR STRUCTURE AND MANUFACTURING METHOD OF SEMICONDUCTOR STRUCTURE

(71) Applicant: CHANGXIN MEMORY TECHNOLOGIES, INC., Hefei (CN)

(72) Inventor: Chun-Sheng Juan Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 163 days.

(21) Appl. No.: 17/446,829

(22) Filed: Sep. 2, 2021

(65) Prior Publication Data
US 2022/0068936 A1    Mar. 3, 2022

Related U.S. Application Data

(63) Continuation of application No. PCT/CN2021/101618, filed on Jun. 22, 2021.

(30) Foreign Application Priority Data

Aug. 27, 2020   (CN) .......................... 202010878114.1

(51) Int. Cl.
*H10B 12/00*    (2023.01)

(52) U.S. Cl.
CPC ........... *H10B 12/485* (2023.02); *H10B 12/31* (2023.02); *H10B 12/34* (2023.02); *H10B 12/488* (2023.02)

(58) Field of Classification Search
CPC ...... H10B 12/485; H10B 12/31; H10B 12/34; H10B 12/488; H10B 12/053; H01L 23/528; H01L 21/76841; H01L 2221/1073
See application file for complete search history.

(56) References Cited

U.S. PATENT DOCUMENTS

| | | | |
|---|---|---|---|
| 5,589,413 A | * | 12/1996 | Sung ...................... H10B 41/30 257/E27.103 |
| 8,119,485 B2 | | 2/2012 | Kim |
| 8,618,615 B2 | | 12/2013 | Kim |
| 8,969,936 B2 | | 3/2015 | Lee |
| 9,082,827 B2 | | 7/2015 | Yu et al. |
| 9,209,241 B2 | | 12/2015 | Kim |
| 9,230,853 B2 | | 1/2016 | Yu et al. |
| 9,881,924 B2 | | 1/2018 | Wang et al. |

(Continued)

FOREIGN PATENT DOCUMENTS

| CN | 101170080 A | 4/2008 |
|---|---|---|
| CN | 103367317 A | 10/2013 |

(Continued)

OTHER PUBLICATIONS

Supplementary European Search Report in the European application No. 21859823.3, dated Aug. 10, 2023. 7 pages.

(Continued)

*Primary Examiner* — Yasser A Abdelaziez
(74) *Attorney, Agent, or Firm* — Syncoda LLC; Feng Ma

(57) ABSTRACT

A semiconductor structure includes a substrate, word lines, bit line contact plugs, and first isolation layers. The word lines are located in the substrate. A bit line contact hole is provided between two adjacent word lines. The bit line contact plugs are located in the bit line contact holes. The first isolation layers are located on side walls of the bit line contact holes and cover side walls of the bit line contact plugs.

13 Claims, 6 Drawing Sheets

(56) References Cited

U.S. PATENT DOCUMENTS

| | | |
|---|---|---|
| 10,163,909 B2 | 12/2018 | Wang et al. |
| 10,566,332 B2 | 2/2020 | Wang et al. |
| 10,672,773 B2 | 6/2020 | Ji et al. |
| 10,978,458 B2 | 4/2021 | Ji et al. |
| 2010/0200948 A1 | 8/2010 | Kim |
| 2012/0080746 A1 | 4/2012 | Kim |
| 2013/0256828 A1 | 10/2013 | Lee |
| 2014/0061939 A1 | 3/2014 | Yu et al. |
| 2014/0110816 A1* | 4/2014 | Kim ................... H10B 12/0335 257/499 |
| 2014/0117492 A1* | 5/2014 | Kim ................... H01L 21/76897 257/508 |
| 2015/0221548 A1 | 8/2015 | Yu et al. |
| 2015/0340453 A1* | 11/2015 | Cho ................... H01L 29/7831 257/330 |
| 2017/0330882 A1 | 11/2017 | Wang et al. |
| 2018/0102366 A1 | 4/2018 | Wang et al. |
| 2019/0088658 A1 | 3/2019 | Wang et al. |
| 2019/0296024 A1* | 9/2019 | Ji ....................... H10B 12/0335 |
| 2020/0203354 A1 | 6/2020 | Lee |
| 2020/0266198 A1 | 8/2020 | Ji et al. |
| 2022/0115382 A1 | 4/2022 | Lee |

FOREIGN PATENT DOCUMENTS

| | | |
|---|---|---|
| CN | 103779318 A | 5/2014 |
| CN | 107731907 A | 2/2018 |
| CN | 108899309 A | 11/2018 |
| CN | 108987282 A | 12/2018 |
| CN | 109148376 A | 1/2019 |
| CN | 208706648 U | 4/2019 |
| CN | 110071108 A | 7/2019 |
| CN | 110364529 A | 10/2019 |
| CN | 110890365 A | 3/2020 |
| CN | 110890368 A | 3/2020 |
| JP | 2015053477 A | 3/2015 |
| JP | 2016009788 A | 1/2016 |

OTHER PUBLICATIONS

First Office Action of the Japanese application No. 2022-554918, dated Oct. 17, 2023. 9 pages with English translation.

* cited by examiner

SEMICONDUCTOR STRUCTURE AND MANUFACTURING METHOD OF SEMICONDUCTOR STRUCTURE

CROSS-REFERENCE TO RELATED APPLICATIONS

This is a continuation of International Patent Application No. PCT/CN2021/101618 filed on Jun. 22, 2021, which claims priority to Chinese Patent Application No. 202010878114.1 filed on Aug. 27, 2020. The disclosures of these applications are hereby incorporated by reference in their entirety.

BACKGROUND

With the increasing integration of semiconductors and the gradual reduction of a circuit dimension, a coupling phenomenon between bit line contact plugs and word lines can occur, thereby affecting device performance.

SUMMARY

The present disclosure relates generally to the technical field of semiconductors, and more specifically to a semiconductor structure and a manufacturing method of a semiconductor structure.

According to a first aspect of the present disclosure, a semiconductor structure is provided. The semiconductor structure may include:
 a substrate;
 word lines, located in the substrate, a bit line contact hole being provided between each two adjacent word lines;
 bit line contact plugs, located in the bit line contact holes; and
 first isolation layers, located on side walls of the bit line contact holes and covering side walls of the bit line contact plugs.

According to a second aspect of the present disclosure, a manufacturing method of a semiconductor structure is provided. The manufacturing method of the semiconductor structure may include:
 providing a substrate;
 forming word lines in the substrate, and forming a bit line contact hole between each two adjacent word lines;
 forming a first isolation layer on a side wall of the bit line contact hole; and
 forming a bit line contact plug in the first isolation layer, the first isolation layer covering a side wall of the bit line contact plug.

BRIEF DESCRIPTION OF THE DRAWINGS

Various objects, features, and advantages of the present disclosure will become more apparent from the following detailed description of preferred implementations of the present disclosure when considered in conjunction with the accompanying drawings. The drawings are merely exemplary illustrations of the present disclosure and are not necessarily drawn to scale. In the drawings, like reference numerals refer to the same or similar components throughout, where.

DETAILED DESCRIPTION

Figure 1:
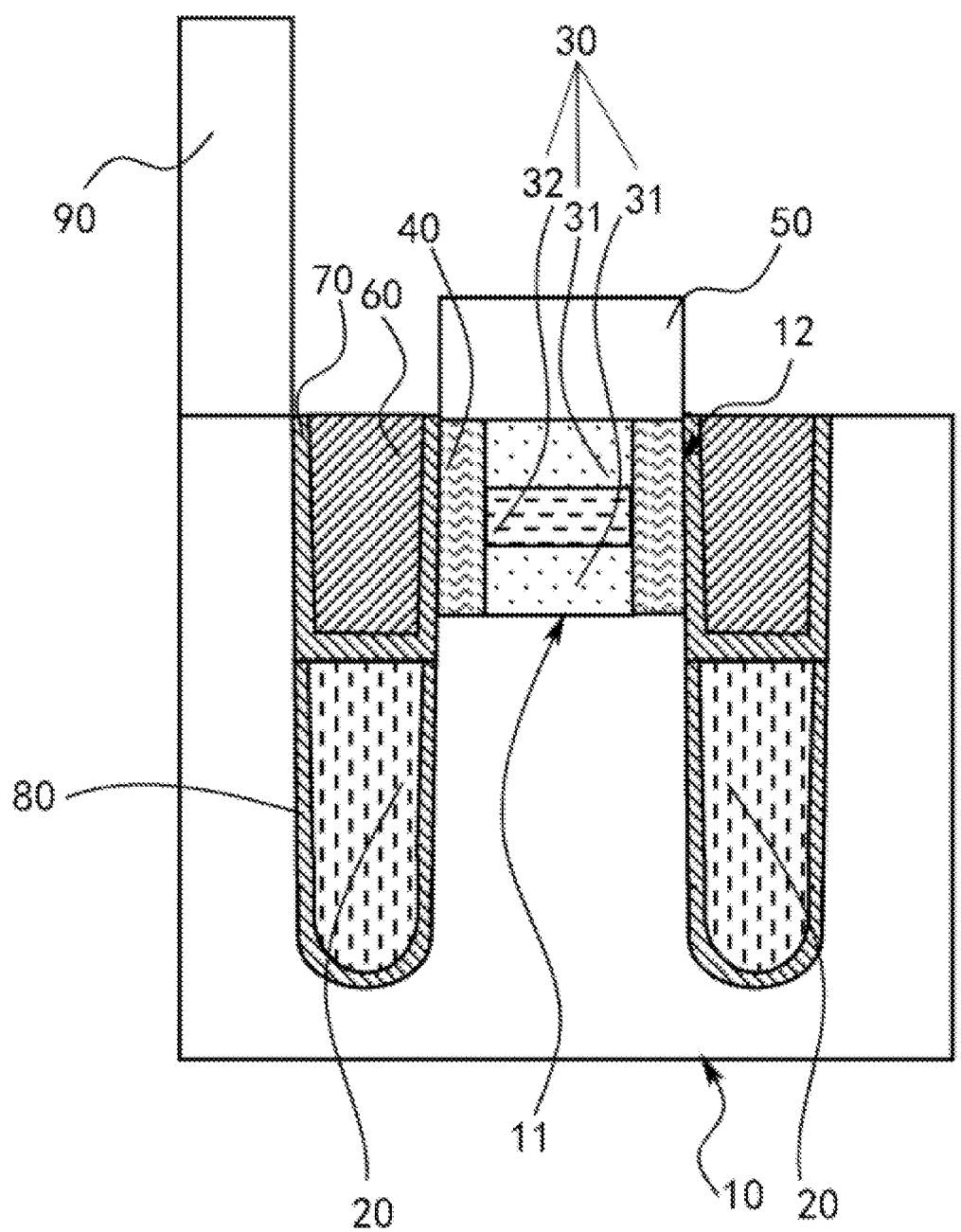
FIG. 1 is a schematic structure diagram of a semiconductor structure according to an exemplary implementation.

Exemplary embodiments that embody the features and advantages of the present disclosure will be described in detail in the following description. It will be appreciated that the present disclosure may have various changes in different embodiments without departing from the scope of the present disclosure, and that the description and drawings are illustrative in nature and are not intended to limit the present disclosure.

In the following description of various exemplary implementations of the present disclosure, reference is made to the accompanying drawings, which form a part of the present disclosure, and in which various exemplary structures, systems, and steps capable of implementing various aspects of the present disclosure are shown by way of examples. It will be appreciated that other specific solutions of components, structures, exemplary devices, systems, and steps may be utilized and structural and functional modifications may be made without departing from the scope of the present disclosure. Moreover, although the terms "on", "between", "in", etc. may be used in this specification to describe different exemplary features and elements of the present disclosure, these terms are used herein for convenience only, e.g., in accordance with the orientation of the examples in the figures. Nothing in this specification should be construed as requiring a particular three-dimensional orientation of the structure to fall within the scope of the present disclosure.

The present disclosure provides a semiconductor structure and a manufacturing method of a semiconductor structure, to improve the performance of the semiconductor structure.

According to a first aspect of the present disclosure, a semiconductor structure is provided. The semiconductor structure may include: a substrate; word lines, located in the substrate, a bit line contact hole being provided between each two adjacent word lines; bit line contact plugs, located in the bit line contact holes; and first isolation layers, located on side walls of the bit line contact holes and covering side walls of the bit line contact plugs.

In an embodiment of the present disclosure, the first isolation layer may include a silicon oxide layer and a silicon nitride layer. The silicon oxide layer may be in contact with the side wall of the bit line contact hole. The silicon nitride layer may be in contact with the bit line contact plug.

In an embodiment of the present disclosure, a bottom end of the first isolation layer may be flush with a bottom end of the bit line contact plug, and/or, the first isolation layer may be not lower than an upper surface of the substrate.

In an embodiment of the present disclosure, the bit line contact plug may be a multi-layer structure. The multi-layer structure may include polycrystalline silicon and a metal material.

In an embodiment of the present disclosure, the bit line contact plug may be a three-layer structure including the metal material and two layers of polycrystalline silicon, in which the metal material is sandwiched between two layers of polycrystalline silicon.

In an embodiment of the present disclosure, the metal material may be not higher than the upper surface of the substrate.

In an embodiment of the present disclosure, the bit line contact plug may include polycrystalline silicon.

In an embodiment of the present disclosure, the semiconductor structure may further include: second isolation layers, located on the word lines; and word line surface layers, located in the second isolation layers, the second isolation layers covering side walls and bottom walls of the word line surface layers.

The bit line contact plug is located between two adjacent second isolation layers.

In an embodiment of the present disclosure, the semiconductor structure may further include: nitride layers, located between the second isolation layers and the word lines.

In an embodiment of the present disclosure, a bottom end of the first isolation layer may be higher than a bottom end of the second isolation layer.

In an embodiment of the present disclosure, the semiconductor structure may further include: a capacitor, located on the substrate.

According to a second aspect of the present disclosure, a manufacturing method of a semiconductor structure is provided. The manufacturing method of the semiconductor structure may include: providing a substrate; forming word lines in the substrate, and forming a bit line contact hole between each two adjacent word lines; forming a first isolation layer on a side wall of the bit line contact hole; and forming a bit line contact plug in the first isolation layer, the first isolation layer covering a side wall of the bit line contact plug.

In an embodiment of the present disclosure, forming the bit line contact plug may include: covering a first layer of polycrystalline silicon in the first isolation layer, the first layer of polycrystalline silicon covering the bit line contact hole; covering a metal material on the polycrystalline silicon; and covering a second layer of polycrystalline silicon on the metal material.

In an embodiment of the present disclosure, the manufacturing method of the semiconductor structure, before forming the first isolation layer, may further include: forming second isolation layers on the word lines; and forming word line surface layers in the second isolation layers, the second isolation layers covering side walls and bottom walls of the word line surface layers.

In an embodiment of the present disclosure, forming the first isolation layer may include: forming an opening on the substrate, and exposing the second isolation layers, the opening serving as the bit line contact hole; and forming the first isolation layer on a side wall of the opening.

According to the semiconductor structure of the present disclosure, the first isolation layer covers the side wall of the bit line contact hole. That is, the first isolation layer is arranged between the bit line contact plug and the side wall of the bit line contact hole, so that a coupling effect between the bit line contact plug and the word line can be reduced, and thus the performance of the semiconductor structure can be improved.

The present disclose will be described below in detail with reference to the accompanying drawings.

An embodiment of the present disclosure provides a semiconductor structure. Referring to FIG. 1, the semiconductor structure includes: a substrate 10; word lines 20 located in the substrate 10, a bit line contact hole 11 being provided between two adjacent word lines 20; bit line contact plugs 30 located in bit line contact holes 11; and first isolation layers 40 located on side walls of the bit line contact holes 11 and cover side walls of the bit line contact plugs 30.

According to the semiconductor structure of an embodiment of the present disclosure, the first isolation layer 40 covers the side wall of the bit line contact hole 11, that is, the first isolation layer 40 is arranged between the side walls of the bit line contact plug 30 and the bit line contact hole 11, so that a coupling effect between the bit line contact plug 30 and the word lines 20 can be reduced, and thus the performance of the semiconductor structure can be improved.

It is noted that the word line 20 is an embedded word line. A bit line contact hole 11 is provided between two word lines 20. A bottom wall of the bit line contact hole 11 is higher than a top surface of the word line 20. That is, a bottom surface of the bit line contact plug 30 is higher than the top surface of the word line 20.

In an embodiment, the substrate 10 may include a semiconductor substrate. The semiconductor substrate may be formed of a silicon-containing material. The semiconductor substrate may be formed of any suitable material, including, e.g., at least one of silicon, monocrystalline silicon, polycrystalline silicon, amorphous silicon, silicon germanium, monocrystalline silicon germanium, polycrystalline silicon germanium, and carbon-doped silicon.

In an embodiment, the word line 20 includes a metal material, which may include at least one of tungsten nitride (WN), molybdenum nitride (MoN), titanium nitride (TIN), tantalum nitride (TaN), titanium silicon nitride (TiSiN), tantalum silicon nitride (TaSiN), or tungsten (W). The specific structure of the word line 20 is not limited herein, and structures known in the related art may be employed.

In an embodiment, as shown in FIG. 1, the semiconductor structure further includes a bit line 50. The bit line 50 is located on the bit line contact plug 30. That is, the bit line 50 is connected to the bit line contact plug 30.

In an embodiment, the bit line 50 includes a metal material, which may include at least one of tungsten nitride (WN), molybdenum nitride (MoN), titanium nitride (TIN), tantalum nitride (TaN), titanium silicon nitride (TiSiN), tantalum silicon nitride (TaSiN), or tungsten (W). The specific structure of the bit line 50 is not limited herein, and structures known in the related art may be employed.

In an embodiment, the bit line 50 covers an upper surface of the bit line contact plug 30.

In an embodiment, the first isolation layer 40 includes a silicon oxide layer and a silicon nitride layer. The silicon oxide layer is in contact with the side wall of the bit line contact hole 11. The silicon nitride layer is in contact with the bit line contact plug 30. In view of the arrangement of the metal material in the bit line contact plug 30, the arrangement of the silicon nitride layer may prevent the metal material in the bit line contact plug 30 from diffusing into the silicon oxide layer.

Specifically, for example, the bit line contact plug 30 includes polycrystalline silicon 31 and a metal material 32.

At this point, the silicon nitride layer may cover only the metal material 32, although it may also completely cover the bit line contact plug 30. As shown in FIG. 1, the bit line contact plug 30 includes two layers of polycrystalline silicon 31 and a metal material 32 located therebetween. At this point, the silicon nitride layer may cover only the upper layer of polycrystalline silicon 31 and the metal material 32, but not cover the lower layer of polycrystalline silicon 31. This arrangement not only isolates the metal material from the silicon oxide layer, but also increases the contact area of the lower layer of polycrystalline silicon 31 with the substrate 10, thereby further reducing the contact resistance.

It is noted that the resistance value of the bit line contact plug 30 can be reduced when the bit line contact plug 30 includes the metal material 32, and the contact area of the lower layer of polycrystalline silicon 31 with the substrate 10 can be increased when the lower layer of polycrystalline silicon 31 does not cover the silicon nitride layer, thereby further reducing the contact resistance.

In an embodiment, a thickness of the silicon nitride layer may be smaller than a thickness of the silicon oxide layer. For example, the silicon nitride layer may have a thickness of 1 nm-3 nm. Specifically, the silicon nitride layer has a thickness of 1 nm, 1.5 nm, 2 nm, 2.5 nm, or 3 nm.

In an embodiment, a bottom end of the first isolation layer 40 is flush with a bottom end of the bit line contact plug 30, and/or, the first isolation layer 40 is not lower than an upper surface of the substrate 10.

It is noted that an upper surface of the first isolation layer 40 may be flush with the upper surface of the substrate 10. Alternatively, an upper surface of the first isolation layer 40 may be higher than the upper surface of the substrate 10. That is, the bit line contact plug 30 protrudes beyond the upper surface of the substrate 10.

In an embodiment, the bit line contact plug 30 is a multi-layer structure, which includes polycrystalline silicon 31 and a metal material 32. The arrangement of the metal material 32 may reduce the resistance value of the bit line contact plug 30. The metal material 32 may be copper (Cu), aluminum (Al), tungsten (W), or alloys thereof, and may be selected according to practical requirements without further limitation herein.

In an embodiment, as shown in FIG. 1, the bit line contact plug 30 is a three-layer structure in which the metal material 32 is sandwiched between two layers of polycrystalline silicon 31.

It is noted that the polycrystalline silicon 31 may be ion-doped, doped elements may be boron (B), phosphorus (P), or arsenic (As). In the present embodiment, the polycrystalline silicon may be doped with the element of phosphorus (P). In other embodiments, the polycrystalline silicon may be ion-doped with other elements. In an embodiment, the ion doped concentrations of the two layers of polycrystalline silicon 31 may be equal. Alternatively, the ion doped concentrations of the two layers of polycrystalline silicon 31 may be unequal. For example, the ion doped concentration of the lower layer of polycrystalline silicon 31 is higher than the ion doped concentration of the upper layer of polycrystalline silicon 31. At this point, since the ion doped concentration of the lower layer of polycrystalline silicon 31 is high, the contact resistance with an active region of the substrate 10 can be reduced, and since the ion doped concentration of the upper layer of polycrystalline silicon 31 is low, the coupling effect between the bit line contact plug 30 and the word line 20 can be further reduced.

Specifically, the upper layer of polycrystalline silicon 31 may have an ion doped concentration of 1E20-1E21, and the lower layer of polycrystalline silicon 31 may have an ion doped concentration of 5E20-5E21.

In an embodiment, the metal material 32 is not higher than the upper surface of the substrate 10. That is, the metal material 32 is located in the bit line contact hole 11, and the upper surface of the bit line contact plug 30 may be higher than the upper surface of the substrate 10.

In an embodiment, the bit line contact plug 30 includes polycrystalline silicon 31. The polycrystalline silicon 31 is ion-doped to meet the conductivity requirements, and the polycrystalline silicon 31 may be doped with phosphorus (P). Specifically, the bit line contact plug 30 consists only of ion-doped polycrystalline silicon 31.

In an embodiment, as shown in FIG. 1, the semiconductor structure further includes second isolation layers 70 and word line surface layers 60. The second isolation layers 70 are located on the word lines 20. The word line surface layers 60 are located in the second isolation layers 70. The second isolation layers 70 cover side walls and bottom walls of the word line surface layers 60. The bit line contact plug 30 is located between two adjacent second isolation layers 70. The word line surface layers 60 and the second isolation layers 70 are also filled in the substrate 10 to embed the word lines 20 in the substrate 10 and achieve an insulation and isolation function.

In an embodiment, the semiconductor structure further includes nitride layers, located between the second isolation layers 70 and the word lines 20, thereby preventing the metal materials of the word lines 20 from diffusing into the second isolation layers 70.

It is noted that a thickness of the nitride layer is smaller than a thickness of the second isolation layer 70. The nitride layer may include silicon nitride. The second isolation layer 70 may include silicon oxide.

In an embodiment, the word line surface layer 60 includes silicon nitride. That is, the second isolation layer 70 may form an ONO-layer structure of silicon oxide-silicon nitride-silicon oxide with the word line surface layer 60.

In an embodiment, a bottom end of the first isolation layer 40 is higher than a bottom end of the second isolation layer 70.

In an embodiment, the thickness of the second isolation layer 70 is greater than a thickness of a third isolation layer 80.

In an embodiment, the first isolation layer 40 is in contact with the second isolation layer 70.

In an embodiment, as shown in FIG. 1, the semiconductor structure further includes third isolation layers 80. The third isolation layers 80 are located in the substrate 10, and cover the side walls and the bottom walls of the word lines 20. Top ends of the third isolation layers 80 are in contact with bottom ends of the second isolation layers 70.

It is noted that the third isolation layer 80 includes a silicon oxide layer and a work function layer. The work function layer is in contact with the word line 20 and the silicon oxide layer is in contact with the substrate 10.

In an embodiment, as shown in FIG. 1, the semiconductor structure further includes a capacitor 90. The capacitor 90 is located on the substrate 10. The capacitor 90 and the bit line 50 are located on two sides of the word line 20 respectively.

Figure 2:
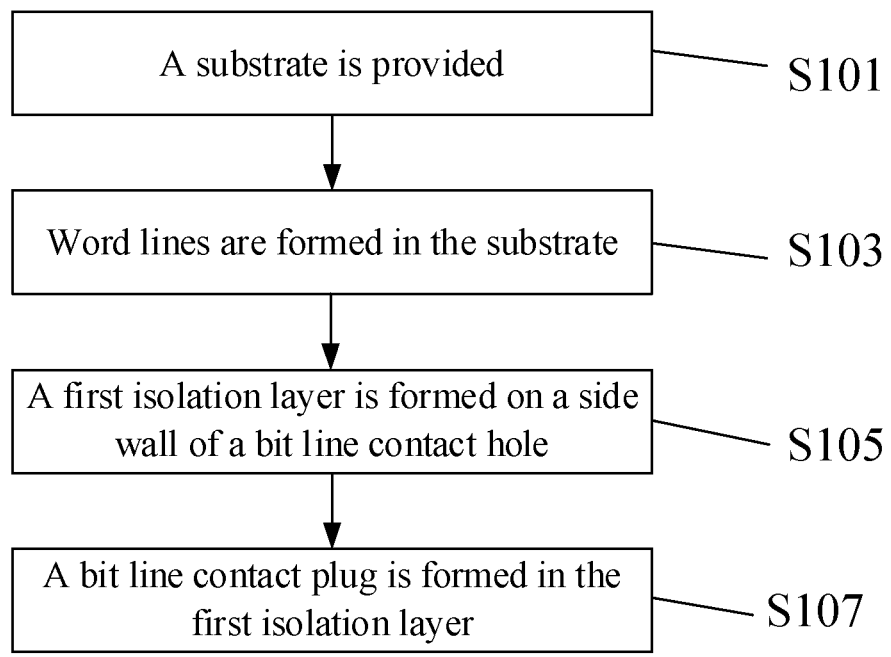
FIG. 2 is a schematic flowchart of a manufacturing method of a semiconductor structure according to an exemplary implementation.

An embodiment of the present disclosure also provides a manufacturing method of a semiconductor structure. Referring to FIG. 2, the manufacturing method of the semiconductor structure includes the following operations.

At S101, a substrate 10 is provided.

At S103, word lines 20 are formed in the substrate 10, and a bit line contact hole 11 is formed between two adjacent word lines 20.

At S105, a first isolation layer 40 is formed on a side wall of the bit line contact hole 11.

At S107, a bit line contact plug 30 is formed in the first isolation layer 40. The first isolation layer 40 covers a side wall of the bit line contact plug 30.

According to the manufacturing method of the semiconductor structure of an embodiment of the present disclosure, the first isolation layer 40 covers the side wall of the bit line contact hole 11, and the bit line contact plug 30 is formed in the first isolation layer 40, so that the first isolation layer 40 is formed between the bit line contact plug 30 and the side wall of the bit line contact hole 11. A coupling effect between the bit line contact plug 30 and the word line 20 can be reduced by the first isolation layer 40, and thus the performance of the semiconductor structure can be improved.

It is noted that the particular forming method for the word lines 20 is not limited herein, and the word lines may be formed according to methods in the related art.

For example, a trench is etched in the substrate 10, a third isolation layer 80 covers a wall of the trench, and then the third isolation layer 80 is filled with a conductive material, so as to form the word line 20. The third isolation layer 80 may include a silicon oxide layer and a work function layer. That is, the wall of the trench is covered with the silicon oxide layer, the silicon oxide layer is then covered with the work function layer, and the word line 20 is formed in the work function layer finally.

Specifically, the word line 20 may include at least one of tungsten nitride (WN), molybdenum nitride (MoN), titanium nitride (TIN), tantalum nitride (TaN), titanium silicon nitride (TiSiN), tantalum silicon nitride (TaSiN), or tungsten (W).

In an embodiment, the manufacturing method of the semiconductor structure includes the following operations. A bit line 50 is formed on the bit line contact plug 30, and a capacitor 90 is formed on the substrate 10.

In an embodiment, the bit line 50 may include at least one of tungsten nitride (WN), molybdenum nitride (MoN), titanium nitride (TIN), tantalum nitride (TaN), titanium silicon nitride (TiSiN), tantalum silicon nitride (TaSiN), or tungsten (W).

In an embodiment, the step of forming the bit line contact plug 30 includes the following operations. Polycrystalline silicon 31 is covered in the first isolation layer 40. The polycrystalline silicon 31 covers the bit line contact hole 11. A metal material 32 is covered on the polycrystalline silicon 31. Polycrystalline silicon 31 is covered on the metal material 32.

The bit line contact plug 30 is formed of three layers of materials. First, polycrystalline silicon 31 is filled in the first isolation layer 40, i.e. a lower layer of polycrystalline silicon 31 is formed. The lower layer of polycrystalline silicon 31 is located in the bit line contact hole 11. Then, a metal material 32 is covered on the lower layer of polycrystalline silicon 31. The metal material 32 is also located in the bit line contact hole 11. At this point, the metal material 32 is not higher than the upper surface of the substrate 10. Finally, polycrystalline silicon 31 is covered above the metal material 32 to form an upper layer of polycrystalline silicon 31.

It is noted that the formed polycrystalline silicon 31 is ion-doped. An ion-doped polycrystalline silicon material may be directly filled into the first isolation layer 40. Alternatively, polycrystalline silicon not doped with ions may be filled first, and after the filling of the polycrystalline silicon is completed, ion implantation is performed to form the ion-doped polycrystalline silicon 31. The specific forming mode is not limited herein and may be selected according to practical requirements.

In an embodiment, the polycrystalline silicon 31 may be doped with phosphorus (P). In other embodiments, the doped elements may be boron (B), arsenic (As), or other ions. The ion doped concentrations of the two layers of polycrystalline silicon 31 may be equal. Or, the ion doped concentrations of the two layers of polycrystalline silicon 31 may not be equal. For example, the ion doped concentration of the lower layer of polycrystalline silicon 31 may be higher than the ion doped concentration of the upper layer of polycrystalline silicon 31. The upper layer of polycrystalline silicon 31 may have an ion doped concentration of 1E20-1E21, and the lower layer of polycrystalline silicon 31 may have an ion doped concentration of 5E20-5E21.

In an embodiment, the metal material 32 may be copper (Cu), aluminum (Al), tungsten (W), or alloys thereof, etc.

In an embodiment, the step of forming the bit line contact plug 30 includes the following operations. Polycrystalline silicon 31 is filled in the first isolation layer 40. That is, the bit line contact plug 30 is formed only of polycrystalline silicon 31. The polycrystalline silicon 31 may be doped with phosphorus (P).

In an embodiment, before forming the first isolation layer 40, the following operations are further included. A second isolation layer 70 is formed on the word line 20. A word line surface layer 60 is formed in the second isolation layer 70. The second isolation layer 70 covers a side wall and a bottom wall of the word line surface layer 60.

Figure 3:
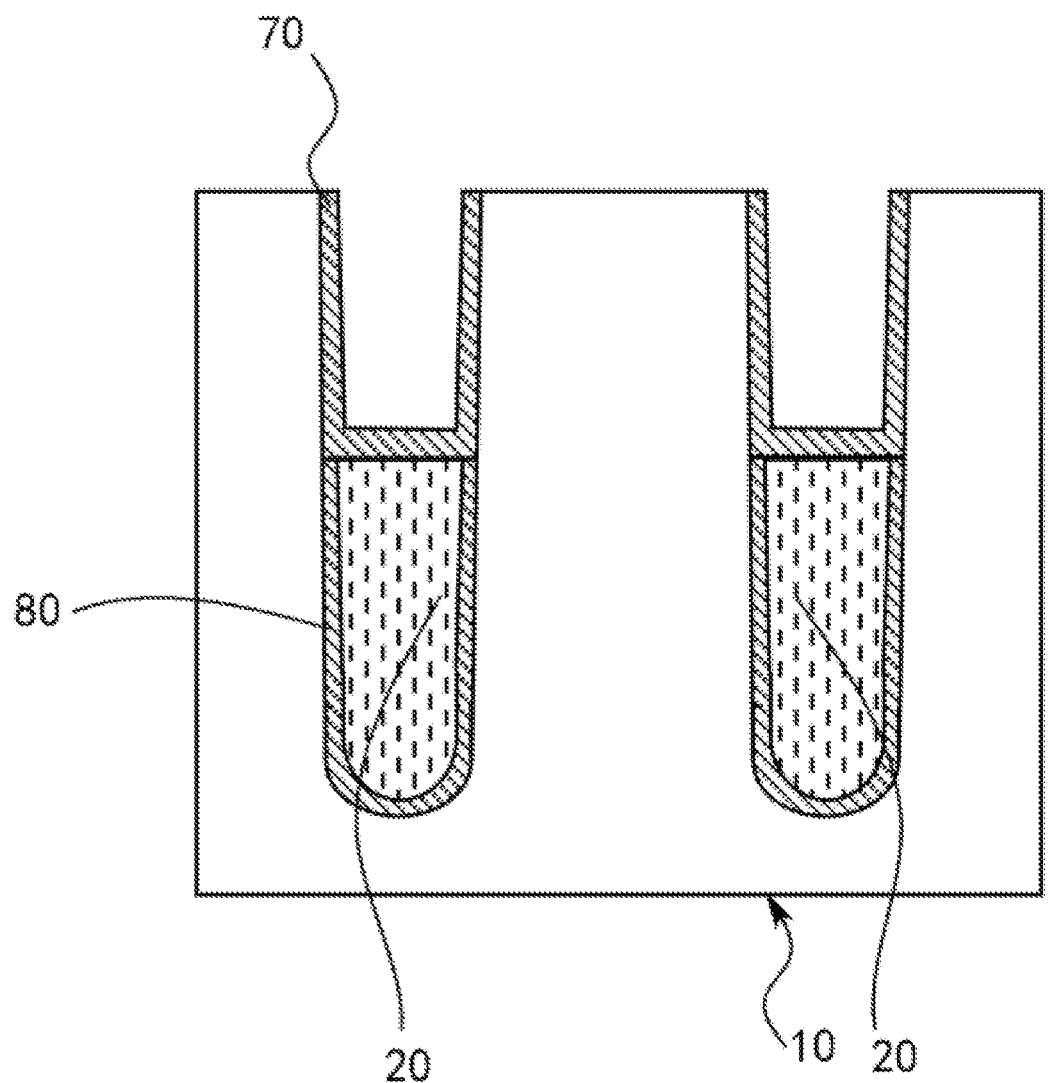
FIG. 3 is a schematic structure diagram of a second isolation layer obtained using a manufacturing method of a semiconductor structure according to an exemplary implementation.

As shown in conjunction with FIG. 3, a trench is formed in the substrate 10, and a third isolation layer 80 and a word line 20 are formed at a lower portion of the trench. Then, a second isolation layer 70 is formed on upper surfaces of the third isolation layer 80 and the word line 20. The second isolation layer 70 covers a side wall of the trench and the upper surfaces of the third isolation layer 80 and the word line 20.

It is noted that before forming the second isolation layer 70, a nitride layer may be formed on the upper surface of the word line 20, and then the second isolation layer 70 may be formed on the nitride layer. The second isolation layer 70 is connected to the silicon oxide layer of the third isolation layer 80, and the second isolation layer 70 may include silicon oxide. The nitride layer may include silicon nitride. The nitride layer may be formed using a Remote Plasma Nitridation (RPN) process.

Figure 4:
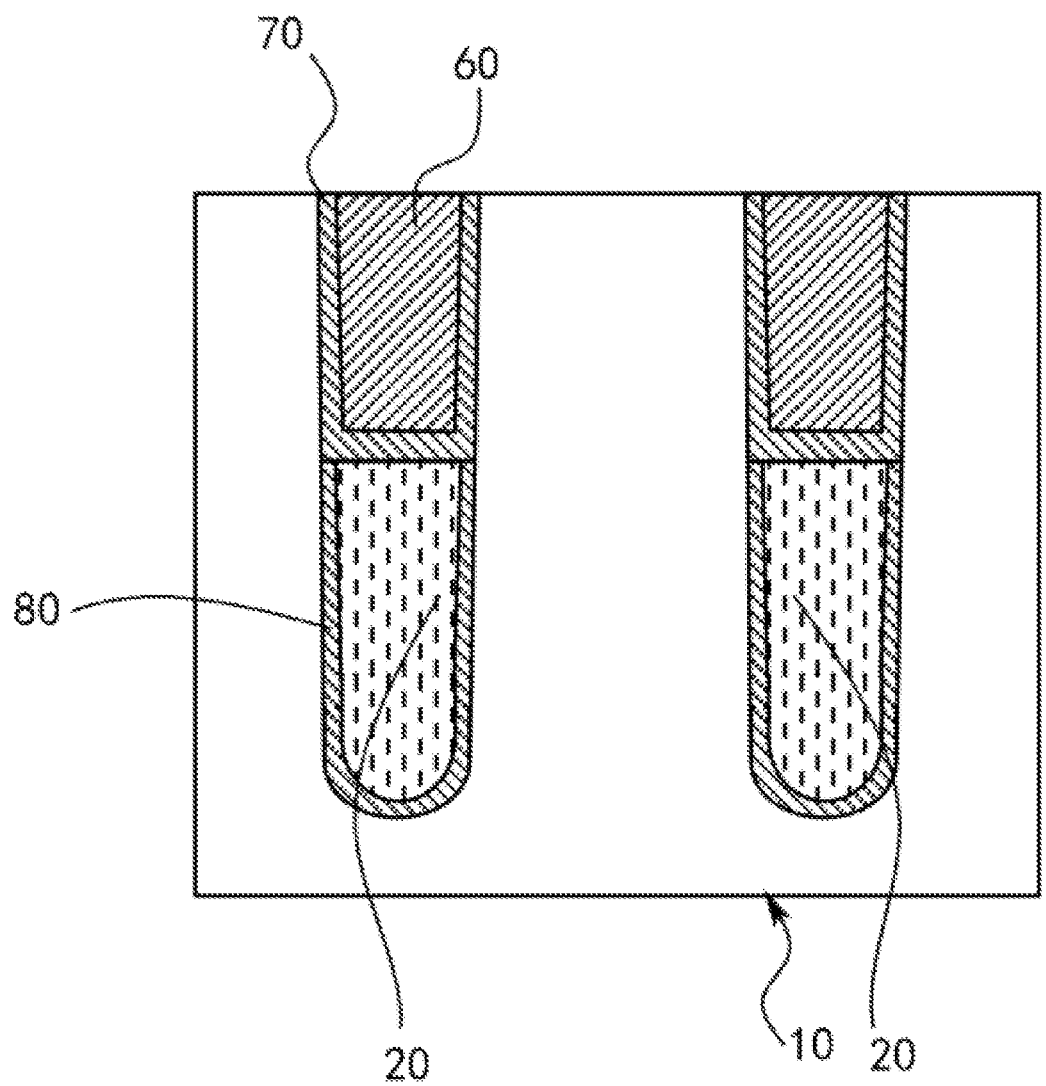
FIG. 4 is a schematic structure diagram of a word line surface layer obtained using a manufacturing method of a semiconductor structure according to an exemplary implementation.

As shown in conjunction with FIG. 4, a word line surface layer 60 is formed in the second isolation layer 70. The word line surface layer 60 includes silicon nitride.

It is noted that the third isolation layer 80, the second isolation layer 70, and the word line surface layer 60 may be formed using a Physical Vapor Deposition (PVD) process, a Chemical Vapor Deposition (CVD) process, or an Atomic Layer Deposition (ALD) process. Etching or Chemical Mechanical Polishing (CMP) may be used for corresponding processing after formation to obtain the structures of FIGS. 3 and 4, and may be selected according to practical requirements without limitation herein.

In an embodiment, the step of forming the first isolation layer 40 includes the following operations. An opening 12 is formed on the substrate 10, and the second isolation layer 70 is exposed. The opening 12 serves as the bit line contact hole 11. The first isolation layer 40 is formed on a side wall of the opening 12.

Figure 5:
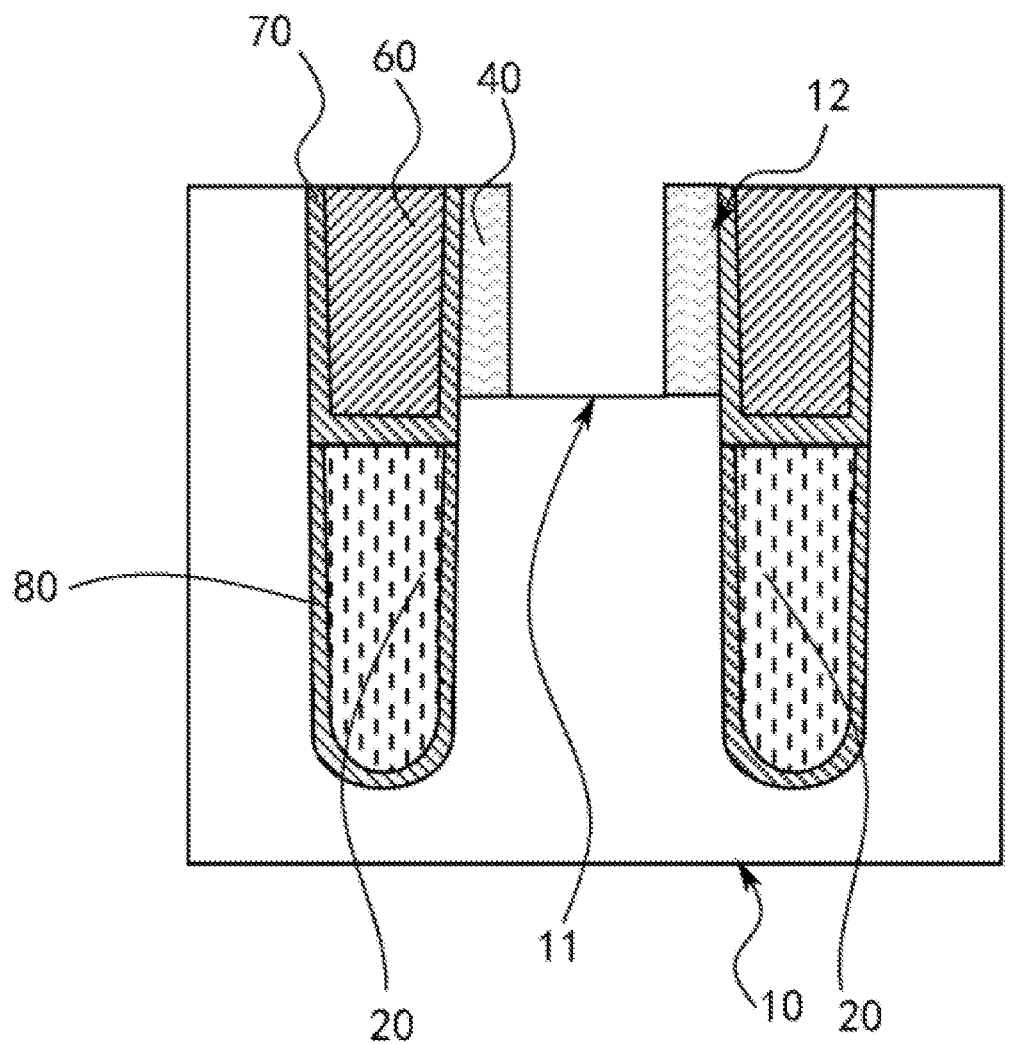
FIG. 5 is a schematic structure diagram of a first isolation layer obtained using a manufacturing method of a semiconductor structure according to an exemplary implementation.

Referring to FIG. 5, on the basis of FIG. 4, the opening 12 is formed between two second isolation layers 70, and the first isolation layer 40 is formed in the opening 12.

Figure 6:
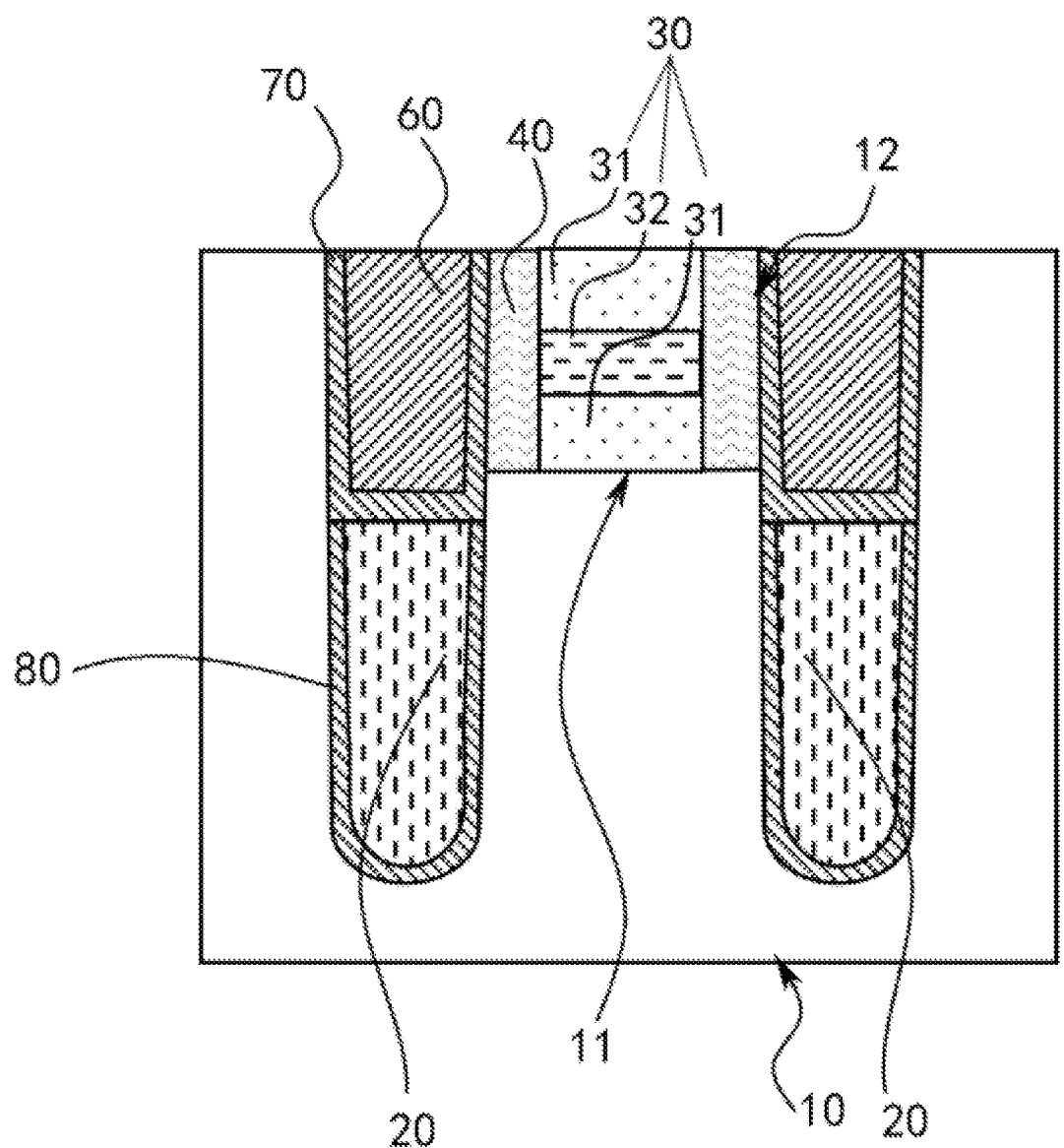
FIG. 6 is a schematic structure diagram of a bit line contact plug obtained using a manufacturing method of a semiconductor structure according to an exemplary implementation.

Specifically, the first isolation layer 40 may be formed using a Physical Vapor Deposition (PVD) process, a Chemical Vapor Deposition (CVD) process, or an Atomic Layer Deposition (ALD) process. In the present embodiment, an isolation layer is deposited in the bit line contact hole 11 by using an ALD process, the isolation layer at the bottom of the bit line contact hole 11 and the isolation layer on the upper surface of the substrate are removed by etching, and the isolation layer on the side wall of the bit line contact hole 11 is retained, so that the first isolation layer 40 is formed, thereby forming the structure shown in FIG. 5. As shown in conjunction with FIG. 6, polycrystalline silicon 31, a metal material 32, and polycrystalline silicon 31 are sequentially filled in the first isolation layer 40 to form a bit line contact plug 30. A bit line 50 is formed on the bit line contact plug 30 and a capacitor 90 is formed on the substrate 10, to form the semiconductor structure shown in FIG. 1.

It is noted that the first isolation layer 40 includes a silicon oxide layer and a silicon nitride layer. That is, the silicon oxide layer is first formed on the side wall of the bit line contact hole 11 (i.e., the side wall of the opening 12). Then, the silicon nitride layer is formed on a side wall of the silicon oxide layer. Finally, the bit line contact plug 30 is formed in the silicon nitride layer. The silicon nitride layer may have a thickness of 1 nm-3 nm.

After considering the specification and implementing the present disclosure disclosed here, it is easy for those of ordinary skill in the art to conceive other implementation solutions of the present disclosure. The present disclosure is intended to cover any variations, uses, or adaptations of the present disclosure following the general principles thereof and including such departures from the present disclosure as come within known or customary practice in the art. It is intended that the specification and example implementations be considered as exemplary only, with a true scope and spirit of the present disclosure being indicated by the claims.

It will be understood that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A semiconductor structure, comprising:
   a substrate;
   word lines, located in the substrate, wherein a bit line contact hole is provided between each two adjacent word lines;
   bit line contact plugs, located in the bit line contact holes; and
   first isolation layers, located on side walls of the bit line contact holes and covering side walls of the bit line contact plugs,
   wherein a bit line contact plug among the bit line contact plugs is a three-layer structure comprising a metal material and two layers of polycrystalline silicon, and
   wherein the metal material is sandwiched between the two layers of polycrystalline silicon.

2. The semiconductor structure of claim 1, wherein the first isolation layer comprises a silicon oxide layer and a silicon nitride layer, the silicon oxide layer is in contact with the side wall of the bit line contact hole, and the silicon nitride layer is in contact with the bit line contact plug.

3. The semiconductor structure of claim 1, wherein a bottom end of the first isolation layer is flush with a bottom end of the bit line contact plug, and the first isolation layer is not lower than an upper surface of the substrate.

4. A semiconductor structure, comprising:
   a substrate;
   word lines, located in the substrate, wherein a bit line contact hole is provided between each two adjacent word lines;
   bit line contact plugs, located in the bit line contact holes; and
   first isolation layers, located on side walls of the bit line contact holes and covering side walls of the bit line contact plugs,
   wherein a bit line contact plug among the bit line contact plugs is a multi-layer structure, the multi-layer structure comprising polycrystalline silicon and a metal material, and
   wherein the metal material is not higher than an upper surface of the substrate.

5. The semiconductor structure of claim 1, wherein the bit line contact plug comprises polycrystalline silicon.

6. The semiconductor structure of claim 1, further comprising:
   second isolation layers, located on the word lines; and
   word line surface layers, located in the second isolation layers, the second isolation layers covering side walls and bottom walls of the word line surface layers,
   wherein the bit line contact plug is located between two adjacent second isolation layers.

7. The semiconductor structure of claim 6, further comprising:
   nitride layers, located between the second isolation layers and the word lines.

8. The semiconductor structure of claim 6, wherein a bottom end of the first isolation layer is higher than a bottom end of the second isolation layer.

9. The semiconductor structure of claim 1, further comprising:
   a capacitor, located on the substrate.

10. The semiconductor structure of claim 1, wherein a bottom end of the first isolation layer is flush with a bottom end of the bit line contact plug, or the first isolation layer is not lower than an upper surface of the substrate.

11. A manufacturing method of a semiconductor structure, comprising:
    providing a substrate;
    forming word lines in the substrate, and forming a bit line contact hole between each two adjacent word lines;
    forming a first isolation layer on a side wall of the bit line contact hole; and
    forming a bit line contact plug in the first isolation layer, the first isolation layer covering a side wall of the bit line contact plug,
    wherein said forming the bit line contact plug comprises:
    depositing a first layer of polycrystalline silicon in the first isolation layer, the first layer of polycrystalline silicon covering the bit line contact hole;
    depositing a metal material on the polycrystalline silicon; and
    depositing a second layer of polycrystalline silicon on the metal material.

12. The manufacturing method of the semiconductor structure of claim 11, prior to said forming the first isolation layer, further comprising:
    forming second isolation layers on the word lines; and
    forming word line surface layers in the second isolation layers, the second isolation layers covering side walls and bottom walls of the word line surface layers.

13. The manufacturing method of the semiconductor structure of claim 12, wherein said forming the first isolation layer comprises:
    forming an opening in the substrate, and exposing the second isolation layers, the opening serving as the bit line contact hole; and
    forming the first isolation layer on a side wall of the opening.

* * * * *